United States Patent
Seong

(10) Patent No.: US 9,287,078 B2
(45) Date of Patent: Mar. 15, 2016

(54) DISPLAY SEALING APPARATUS AND METHOD OF MANUFACTURING DISPLAY APPARATUS BY USING THE SAME

(71) Applicant: SAMSUNG DISPLAY CO., LTD., Yongin, Gyeonggi-Do (KR)

(72) Inventor: Jinwook Seong, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/598,303

(22) Filed: Jan. 16, 2015

(65) Prior Publication Data

US 2016/0035530 A1    Feb. 4, 2016

(30) Foreign Application Priority Data

Aug. 1, 2014    (KR) .......................... 10-2014-0099246

(51) Int. Cl.
| | |
|---|---|
| *H01L 51/56* | (2006.01) |
| *H01J 9/20* | (2006.01) |
| *H01L 51/52* | (2006.01) |
| *C03C 27/10* | (2006.01) |
| *B23K 26/073* | (2006.01) |

(52) U.S. Cl.
CPC ............... *H01J 9/20* (2013.01); *B23K 26/0736* (2013.01); *C03C 27/10* (2013.01); *H01L 51/5246* (2013.01); *H01L 51/56* (2013.01); *H01L 2251/00* (2013.01); *H01L 2251/10* (2013.01); *H01L 2251/56* (2013.01)

(58) Field of Classification Search
CPC . H01L 51/5246; H01L 51/56; H01L 2251/00; H01L 2251/10; H01L 2251/56; C03C 27/00–27/10; B23K 26/0736; B23K 26/103; B29C 65/1629; B29C 65/1648
See application file for complete search history.

(56) References Cited

U.S. PATENT DOCUMENTS

| | | | |
|---|---|---|---|
| 8,507,157 B2 | 8/2013 | Lee | |
| 8,816,243 B2 | 8/2014 | Lee et al. | |
| 2011/0177746 A1* | 7/2011 | Voronov et al. | 445/25 |
| 2012/0000611 A1* | 1/2012 | Lee et al. | 156/380.9 |
| 2014/0174664 A1 | 6/2014 | Lee | |
| 2014/0177077 A1 | 6/2014 | Lee et al. | |
| 2014/0356987 A1* | 12/2014 | Lee et al. | 438/15 |

FOREIGN PATENT DOCUMENTS

| | | |
|---|---|---|
| KR | 10-2002-0088447 A | 11/2002 |
| KR | 10-2009-0065038 A | 6/2009 |
| KR | 10-2011-0080883 A | 7/2011 |
| KR | 10-2012-0020942 A | 3/2012 |
| KR | 10-2014-0081509 A | 7/2014 |
| KR | 10-2014-0081510 A | 7/2014 |

* cited by examiner

*Primary Examiner* — Mariceli Santiago
(74) *Attorney, Agent, or Firm* — Lee & Morse, P.C.

(57) ABSTRACT

A method of manufacturing a display apparatus includes forming a display device on a display area of a rear substrate, aligning the rear substrate and an encapsulation substrate, such that the display device is between the rear substrate and the encapsulation substrate, disposing a sealant between the rear substrate and the encapsulation substrate, such that the sealant is outside the display area and surrounds the display area; and rotating a laser beam along a closed curve while irradiating the laser beam onto an outer surface of the rear substrate or the encapsulation substrate, such that the rear substrate and the encapsulation substrate are sealed.

3 Claims, 3 Drawing Sheets

DISPLAY SEALING APPARATUS AND METHOD OF MANUFACTURING DISPLAY APPARATUS BY USING THE SAME

CROSS-REFERENCE TO RELATED APPLICATION

Korean Patent Application No. 10-2014-0099246, filed on Aug. 1, 2014, in the Korean Intellectual Property Office, and entitled: "Display Sealing Apparatus and Method of Manufacturing Display Apparatus by Using the Same," is incorporated by reference herein in its entirety.

BACKGROUND

1. Field

One or more embodiments relate to a display sealing apparatus and a method of manufacturing a display apparatus by using the same. More particularly, one or more embodiments relate to a display sealing apparatus capable of decreasing an occurrence rate of defects in a sealing process of a display manufacturing procedure, and a method of manufacturing a display apparatus by using the display sealing apparatus.

2. Description of the Related Art

In general, a display apparatus is manufactured by forming a display device, etc. on a rear substrate, arranging the rear substrate and an encapsulation substrate so that the display device is placed between the rear substrate and the encapsulation substrate, and sealing the rear substrate and encapsulation substrate.

SUMMARY

According to one or more embodiments, a display sealing apparatus includes a stage on which a substrate to be processed is disposed, a laser beam source, and a wobbling optical system which rotates and emits a laser beam along a closed curve, which is disposed in a plane that intersects a predetermined axis and makes the predetermined axis be disposed inside the closed curve when the laser beam is emitted by the laser beam source, and which allows the emitted laser beam to reach the substrate disposed on the stage.

The predetermined axis may be parallel to an optical axis of the laser beam emitted from the laser beam source to the wobbling optical system.

The predetermined axis may coincide with the optical axis of the laser beam emitted from the laser beam source to the wobbling optical system.

The closed curve may be the circumference of a circle centered at the predetermined axis.

The wobbling optical system may include: a first reflection plate which reflects a laser beam emitted by the laser beam source in a direction that does not coincide with the optical axis of the laser beam emitted from the laser beam source to the wobbling optical system; a second reflection plate which reflects the laser beam reflected from the first reflection plate in a direction toward the substrate disposed on the stage; and a rotator which rotates the first reflection plate and the second reflection plate at the same angular velocity.

In this case, the wobbling optical system may further include a distance adjusting unit configured to adjust a distance between the first reflection plate and the second reflection plate by adjusting a location of the second reflection plate.

The closed curve may be divided into a plurality of areas, and a first intensity of the laser beam, which reaches the substrate disposed on the stage via a first area of the plurality of areas, may be different from a second intensity of the laser beam which reaches the substrate disposed on the stage via a second area of the plurality of areas.

The first intensity of a laser beam emitted by the laser beam source when the laser beam emitted by the laser beam source passes the first area may be different from the second intensity of a laser beam emitted by the laser beam source when the laser beam emitted by the laser beam source passes the second area.

Alternatively, an intensity adjusting unit may be further included, wherein the intensity adjusting unit is disposed on an optical path via which the laser beam emitted by the laser beam source reaches the substrate and allows the first intensity of the laser beam reaching the substrate on the stage via the first area to be different from the second intensity of the laser beam which reaches the substrate disposed on the stage via the second area.

According to one or more embodiments, a method of manufacturing a display apparatus includes forming a display device on a display area of a rear substrate, aligning the rear substrate and an encapsulation substrate, such that the display device is between the rear substrate and the encapsulation substrate, disposing a sealant between the rear substrate and the encapsulation substrate, such that the sealant is outside the display area and surrounds the display area; and rotating a laser beam along a closed curve while irradiating the laser beam onto an outer surface of the rear substrate or the encapsulation substrate, such that the rear substrate and the encapsulation substrate are sealed.

The closed curve may be the circumference of a circle.

The sealing may include dividing the closed curve into a plurality of areas and making a first intensity of a laser beam, which reaches the rear substrate or the encapsulation substrate via a first area of the plurality of areas, be different from a second intensity of a laser beam which reaches the rear substrate or the encapsulation substrate via a second area of the plurality of areas.

The first intensity and the second intensity of the laser beam may be adjusted by a laser beam source configured to emit the laser beam.

The first intensity and the second intensity of the laser beam may be adjusted by an intensity adjusting unit which is disposed on an optical path via which the laser beam emitted by a laser beam source reach the rear substrate or the encapsulation substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
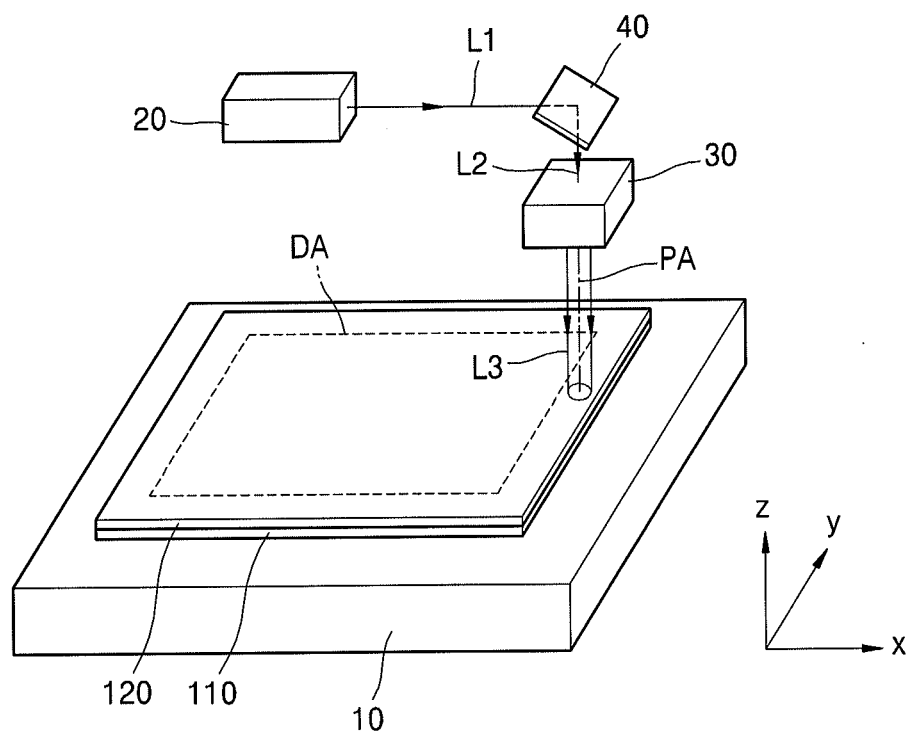
FIG. 1 illustrates a schematic perspective view of a display sealing apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display sealing apparatus according to an embodiment. As shown in FIG. 1, the display sealing apparatus may include a stage 10, a laser beam source 20, and a wobbling optical system 30.

Figure 3:
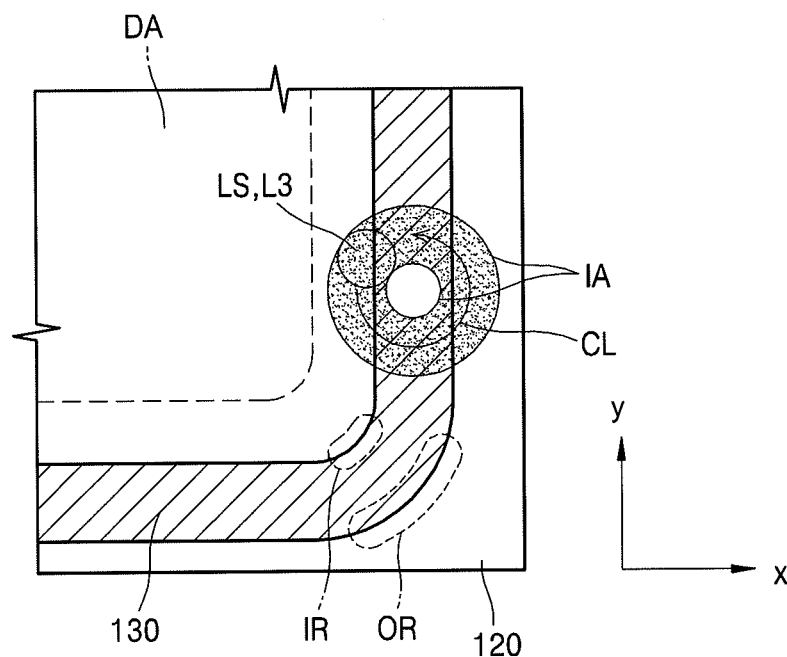
FIG. 3 illustrates a conceptual plan view schematically showing an operation of sealing a display apparatus by using the display sealing apparatus of FIG. 1.

A substrate to be processed is disposed on the stage 10. In FIG. 1, a rear substrate 110 and an encapsulation substrate 120 may be aligned on the stage 10. In a display area DA of the rear substrate 110, a display device, e.g., an organic light-emitting display device, may be disposed. In an outer region of the display area DA of the rear substrate 110 or in an area of the encapsulation substrate 120 which corresponds to the outer region of the display area DA of the rear substrate 110, a sealant 130 may be disposed (FIG. 3). Moreover, the rear substrate 110 and the encapsulation substrate 120 may be aligned so that the display device and the sealant 130 are disposed therebetween. The stage 10, on which the rear substrate 110 and the encapsulation substrate 120 are aligned, may change locations of the rear substrate 110 and encapsulation substrate 120 within an XY plane, according to necessity.

The laser beam source 20 may emit a laser beam L1 to be irradiated onto the rear substrate 110 or the encapsulation substrate 120 aligned on the stage 10. The laser beam L1 that may be emitted by the laser beam source 20 may be a spot beam.

The wobbling optical system 30 allows a laser beam emitted by the laser beam source 20 to reach the rear substrate 110 or the encapsulation substrate 120. As shown in FIG. 1, an initial mirror 40 may be disposed between the laser beam source 20 and the wobbling optical system 30 in order to adjust a path of the laser beam L1 emitted by the laser beam source 20 toward the wobbling optical system 30. Accordingly, the laser beam L1 emitted by the laser beam source 20 is incident on the initial mirror 40, and is reflected from the initial mirror 40 as a laser beam L2 toward the wobbling optical system 30.

When the laser beam L2 is incident on the wobbling optical system 30, the wobbling optical system 30 emits a laser beam while rotating the laser beam along a closed curve. That is, as illustrated in FIG. 1, a laser beam L3 emitted by the wobbling optical system 30 may be rotated around a predetermined PA axis, e.g., around the z-axis, to have a cross-sectional area of a closed curve in the xy-plane. As illustrated in FIG. 1, the closed curve is disposed in a plane that intersects the predetermined axis PA, while the predetermined axis PA is inside the closed curve. As a result, the wobbling optical system 30 allows the emitted laser beam L3 to reach the rear substrate 110 or the encapsulation substrate 120, as will be described in more detail below with reference to FIG. 2.

Figure 2:
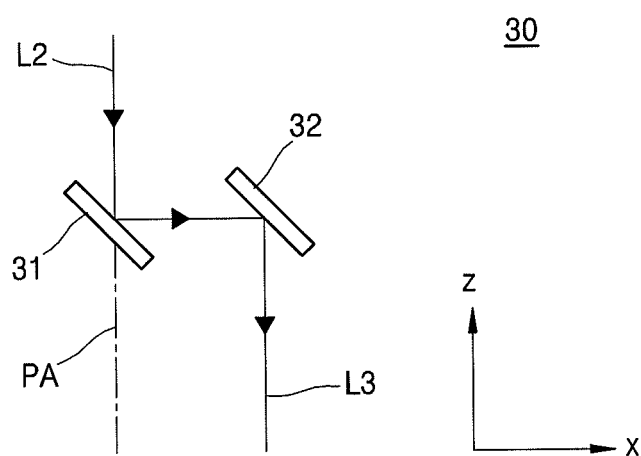
FIG. 2 illustrates a conceptual side view schematically showing portions of the display sealing apparatus of FIG. 1.

FIG. 2 illustrates an exemplary conceptual side view of the wobbling optical system 30. It is noted that the wobbling optical system 30 may have various structures, and the structure shown in FIG. 2 is one example thereof.

Referring to FIG. 2, the wobbling optical system 30 may include a first reflection plate 31, a second reflection plate 32, and a rotator such as a motor (not shown).

The first reflection plate 31 reflects the laser beam L2 emitted by the laser beam source 20 toward the second reflection plate 32. In this case, the first reflection plate 31 is arranged at an angle with respect to the stage 10, so the laser beam L2 is incident onto the first reflection plate 31 not perpendicularly. In other words, the first reflection plate 31 reflects the laser beam L2 emitted from the laser beam source 20 in a direction that does not coincide with an optical axis (a Z axis) of the laser beam L2, as shown in FIG. 2. As illustrated in FIG. 2, the first reflection plate 31 reflects the laser beam L2 about 90 degrees in a positive X direction. If the first reflection plate 31 were to reflect the laser beam L2 emitted from the laser beam source 20 in a direction coinciding with the optical axis (a Z axis), it would require the laser beam L2 to be vertically incident onto the first reflection plate 31.

The second reflection plate 32 reflects a laser beam incident thereon toward the rear substrate 110 or the encapsulation substrate 120 disposed on the stage 10. Accordingly, the laser beam L3 reflected from the second reflection plate 32 is emitted toward the stage 10. FIG. 2 shows that the laser beam L3 is irradiated in a negative Z direction.

In this case, the rotator may rotate the first reflection plate 31 and the second reflection plate 32 at the same angular velocity. The rotator may rotate the first reflection plate 31 and the second reflection plate 32 around, e.g., the z-axis. For example, the rotator may rotate the first reflection plate 31 and the second reflection plate 32 around the optical axis of the laser beam L2 that is incident onto the wobbling optical system 30. If the first reflection plate 31 and the second reflection plate 32 are rotated at the same angular velocity when the laser beam L2 emitted by the laser beam source 20 is incident onto the wobbling optical system 30, the laser beam L3 emitted from the wobbling optical system 30 may also rotate.

In consideration of a trajectory of the laser beam L3 emitted from the wobbling optical system 30 with regard to the plane, e.g., the xy plane, that intersects the predetermined axis PA, e.g., the z-axis, the trajectory becomes a closed curve inside which the predetermined axis PA is located. That is, the trajectory becomes a circumference of a circle centered at the predetermined axis PA. As shown in FIG. 2, the predetermined axis PA may be parallel to the optical axis of the laser beam L2 emitted from the laser beam source 20 toward the wobbling optical system 30. FIG. 2 shows that the predetermined axis PA coincides with the optical axis of the laser beam L2 emitted from the laser beam source 20 toward the wobbling optical system 30.

FIG. 3 is a conceptual plan view schematically showing sealing a display apparatus by using the display sealing apparatus of FIG. 1. If the first reflection plate 31 and the second reflection plate 32 of FIG. 2 are rotated around the predetermined axis PA (a Z axis) by the rotator at the same angular velocity in a counterclockwise direction, the laser beam L3 irradiated onto the rear substrate 110 or the encapsulation substrate 120 may also be rotated in the counterclockwise direction, as shown in FIG. 3. A part occupied by the laser beam L3 is a laser beam spot LS, as further shown in FIG. 3. Therefore, as the laser beam L3 is rotated in the counterclockwise direction, i.e., as the laser beam spot LS is rotated, a laser beam irradiation area IA on the rear substrate 110 or the encapsulation substrate 120 with a donut shape is formed, as shown in FIG. 3.

The sealant 130 disposed between the rear substrate 110 or the encapsulation substrate 120 may be formed of, e.g., sealing glass frit. As the laser beam L3 is irradiated toward the rear substrate 110 or the encapsulation substrate 120, the laser beam L3 is incident on the sealant 130, thereby hardening the sealant 130 to attach the rear substrate 110 and the encapsulation substrate 120 to each other. Since the laser beam L3 needs to be irradiated along the, e.g., entire length of the, sealant 130 in order to attach the rear substrate 110 and the encapsulation substrate 120, the laser beam L3 is irradiated along the, e.g., entire length of the, sealant 130 while forming the irradiation area IA having the donut shape, as shown in FIG. 3. As such, instead of having an irradiation area that merely traces the shape of the sealant 130, the irradiation area IA according to embodiments is defined by sequentially repeating donut shapes formed by the rotating laser beam.

It may be understood that the donut shape of the laser beam irradiation area IA is a shape of an irradiation area when viewed from the display sealing apparatus, i.e., from a top view as seen from the wobbling optical system 30. For example, if the encapsulation substrate 120 and other components are moved in a certain direction on the stage 10, e.g., along the y-axis direction, while the laser beam L3 is irradiated onto the encapsulation substrate 120 and/or other components, the irradiation area IA of the encapsulation substrate 120 has a spiral shape when viewed in top view from above the encapsulation substrate 120.

A movement velocity of the encapsulation substrate 120 moved by the stage 10 may be low, and a rotation velocity of the first reflection plate 31 and the second reflection plate 32 on the wobbling optical system 30 may be high, i.e., the linear velocity of the encapsulation substrate 120 may be low relative to the rotation velocity of the first reflection plate 31 and the second reflection plate 32. In this case, it may be understood that the irradiation area IA of the encapsulation substrate 120 has also a shape similar to a donut when viewed from the encapsulation substrate 120. For example, the first reflection plate 31 and the second reflection plate 32 on the wobbling optical system 30 may be rotated about 150 times per second.

When a sealing process is performed by using the display sealing apparatus according to the present embodiment, an occurrence rate of defects in the sealing process of a display manufacturing procedure may be greatly decreased.

In general, it is important to irradiate a laser beam with a predetermined and uniform intensity onto a sealant. However, the intensity of the laser beam may be non-uniform because of internal or external factors. In this case, an intensity of a laser beam irradiated onto a certain part of the sealant may be different from that of a laser beam irradiated onto another part of the sealant, and accordingly, the rear substrate and the encapsulation substrate may not be attached to each other at a uniform intensity. When the sealant has defects caused by such differences during the sealing process, problems such as improper or wakened adhesion of the rear substrate and the encapsulation substrate may be caused. Such weakened or improper adhesion may result in the separation of the rear substrate and the encapsulation substrate, as well we the deterioration of the display device disposed between the rear substrate and the encapsulation substrate, etc.

In contrast, in the display sealing apparatus according to the present embodiment, the laser beam L3 is quickly rotated by the wobbling optical system 30, while being irradiated onto the encapsulation substrate 120, as described above. Thus, the irradiation area IA irradiated by the laser beam L3 has a donut shape. Accordingly, even if a sudden change of a laser beam output in the laser beam source 20 occurs, the laser beam L3 is irradiated onto an entire irradiation area IA at substantially the same intensity.

In addition, in a case where the laser beam L3 is irradiated to attach the rear substrate 110 to the encapsulation substrate 120, even if an area, i.e., a diameter, of the laser beam spot LS of the laser beam L3 is smaller than a width of the sealant 130, an area of the irradiation area IA, i.e., a rotation diameter of the laser L3 indicated by CL in FIG. 3, may correspond to or may be greater than the width of the sealant 130 because the laser beam L3 is rotated fast by the wobbling optical system 30 while being irradiated onto the encapsulation substrate 120. Furthermore, since the area of the irradiation area IA may be easily adjusted by adjusting a distance between the first and second reflection plates 31 and 32, the display sealing apparatus according to the present embodiment may be used even when display apparatuses, which have different specifications such as different widths of sealants, are manufactured.

For example, in the case of the irradiation area IA shown in FIG. 3, the path CL via which a center of the laser beam L3 passes means a closed curve to which the above-described laser beam is irradiated. In FIG. 3, the closed curve may be a circumference of a circle. In FIG. 3, although a diameter of the spot LS of the laser beam L3, e.g., about 1.3 mm, is smaller than a width of the sealant 130, e.g., about 2 mm, a constant amount of energy is sufficiently transmitted to an entire surface of the sealant 130 because a circle defined by the path CL via which the center of the laser beam L3 passes has a diameter of about 2.6 mm.

Figure 4:
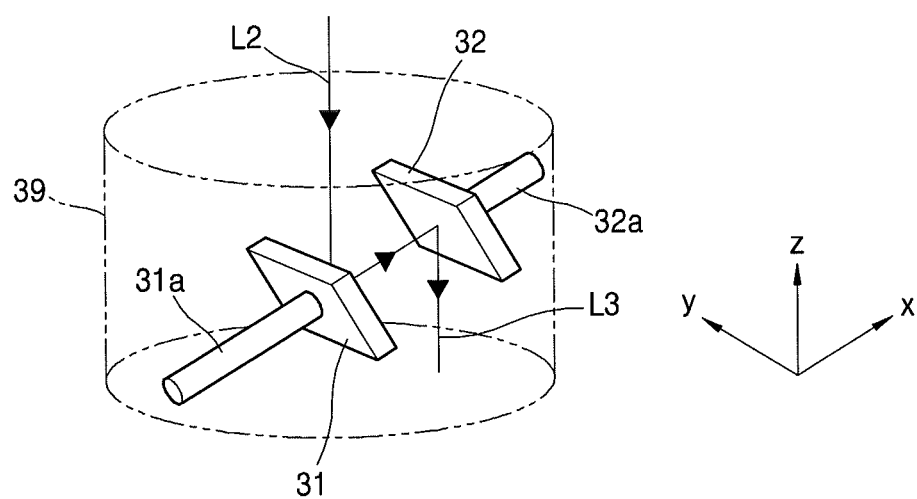
FIG. 4 illustrates a schematic perspective view of portions of a display sealing apparatus according to another embodiment.

FIG. 4 is a schematic perspective view of portions of a display sealing apparatus according to another embodiment.

As shown in FIG. 4, the first reflection plate 31 is fixed to a frame 39, which has a hollow cylinder shape, by a fixing unit 31a. Further, the second reflection plate 32 may also be fixed to the frame 39 by a second fixing unit 32a. As the rotator such as a motor rotates the frame 39, which has the hollow cylinder shape, the laser beam L3 emitted from the wobbling optical system 30 may also be rotated. A rotation center of the frame 39 may coincide with the optical axis of the laser beam L2 emitted from the laser beam source 20 toward the wobbling optical system 30.

The second fixing unit 32a may function as a distance adjusting unit which adjusts a distance between the first reflection plate 31 and the second reflection plate 32 by adjusting a location of the second reflection plate 32. If the second fixing unit 32a adjusts the distance between the first reflection plate 31 and the second reflection plate 32, while the rotator rotates the frame 39 once, the path CL (refer to FIG. 3) via which the center of the laser beam L3 passes on an outer surface of the encapsulation substrate 120 (an upper surface in a positive Z direction) may be a closed curve having a different shape than a circle. For example, the path CL via which the center of the laser beam L3 passes on the outer surface of the encapsulation substrate 120 (the upper surface in the positive Z direction) may be an ellipse.

Figure 5:
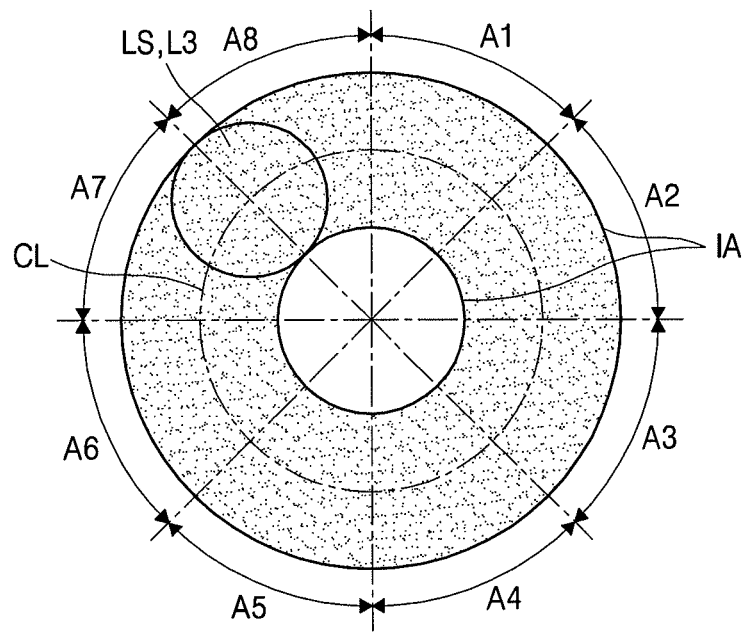
FIG. 5 illustrates a conceptual view showing intensity control of a laser beam emitted from a display sealing apparatus according to another embodiment.
Figure 6:
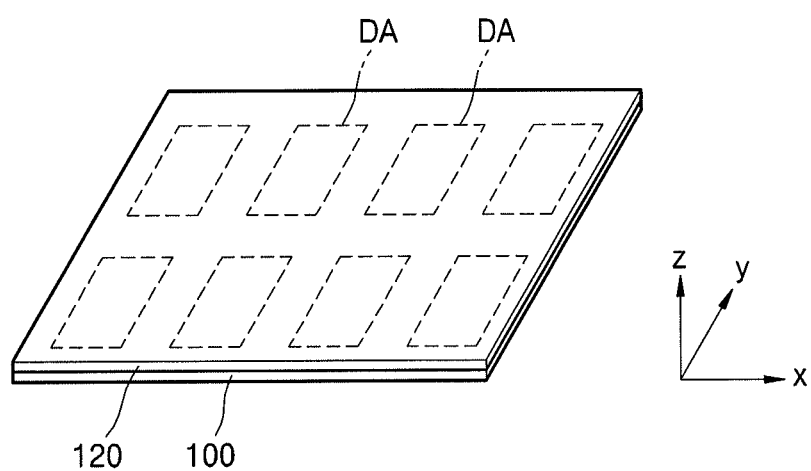
FIG. 6 illustrates a schematic perspective view of a manufacturing procedure for explaining a method of sealing a display according to an embodiment.

FIG. 5 is a conceptual view showing intensity control of the laser beam emitted from the display sealing apparatus according to another embodiment. In the case of the display sealing apparatus according to the present embodiment, the above-described closed curve is divided into multiple areas, and a first intensity of a laser beam reaching the encapsulation substrate 120, etc. disposed on the stage 10 via a first area of the multiple areas may be different from a second intensity of a laser beam reaching the encapsulation substrate 120, etc. disposed on the stage 10 via a second area of the multiple areas.

For example, as shown in FIG. 5, if the path CL via which the center of the laser beam L3 passes is a closed curve having a circumferential shape when the laser beam L3 is rotated once, the closed curve having the circumferential shape may be divided into eight areas A1 through A8. The intensity of the laser beam L3 irradiated onto the encapsulation substrate 120, etc. in at least some of the areas A1 through A8 may be different from that of the laser beam L3 irradiated onto the encapsulation substrate 120, etc. in the other of the areas A1 through A8. For example, when the center of the laser beam L3 is in the first area A1, the laser beam L3 is irradiated onto the encapsulation substrate 120, etc. at a first intensity. When the center of the laser beam L3 is in the second area A2, the laser beam L3 is irradiated onto the encapsulation substrate 120, etc. at a second intensity different from the first intensity.

As shown in FIG. 3, when the laser beam L3 is irradiated onto an area where the sealant 130 is curved, if the laser beam L3 is irradiated onto the area at substantially the same intensity, an inner region IR of the sealant 130 at the curve may be irradiated with a laser beam having a relatively greater intensity than an outer region OR of the sealant 130 at the curve. It is because an area of the inner region IR of the sealant 130 is smaller than that of the outer region OR of the sealant 130 at the curve. When this happens, during the sealing process, a temperature of the sealant 130 may vary according to location on, i.e., portion of, the sealant 130. Accordingly, the sealant 130 may not attach the rear substrate 110 to the encapsulation substrate 120 at a uniform intensity.

In contrast, in the case of the display sealing apparatus according to the present embodiment, intensities of the laser beam reaching the encapsulation substrate 120, etc. may be adjusted according to the areas A1 through A8 while the laser beam L3 is rotated once. Therefore, as shown in FIG. 3, when the laser beam L3 is irradiated onto the area where the sealant 130 is curved, the intensity of the laser beam reaching the encapsulation substrate 120 becomes the first intensity in an area corresponding to the inner region IR of the sealant 130 of the areas A1 through A8 of the closed curve, and the intensity of the laser beam reaching the encapsulation substrate 120 becomes the second intensity in an area corresponding to the outer region OR of the sealant 130 of the areas A1 through A8 of the closed curve. In this regard, the first intensity may be smaller than the second intensity. The sealant 130 may attach the rear substrate 110 to the encapsulation substrate 120 at a uniform intensity by making the sealant 130 have a constant temperature in the area where the sealant 130 is curved.

When the center of the laser beam L3 is in the first area A1, the laser beam L3 is irradiated onto the encapsulation substrate 120, etc. at the first intensity, and when the center of the laser beam L3 is in the second area A2, the laser beam L3 is irradiated onto the encapsulation substrate 120, etc. at the second intensity different from the first intensity. The intensity adjustment may be accomplished by adjusting an intensity of the laser beam L1 emitted by the laser beam source 20. That is, it may be accomplished by making a first intensity of the laser beam L1 emitted by the laser beam source 20 when the laser beam L3 passes the first area A1 be different from a second intensity of the laser beam L1 emitted by the laser beam source 20 when the laser beam L3 passes the second area A2.

Alternatively, the display sealing apparatus may further include an intensity adjusting unit which allows the intensity of the laser beam L1 emitted by the laser beam source 20 to be uniform and adjusts the intensity of the laser beam L3 irradiated onto the encapsulation substrate 120, etc. The intensity adjusting unit may be disposed on an optical path via which the laser beam emitted by the laser beam source 20 reaches the encapsulation substrate 120, etc. disposed on the stage 10.

The intensity adjusting unit may, for example, be disposed on the optical path via which the laser beam emitted by the laser beam source 20 reaches the encapsulation substrate 120, etc. disposed on the stage 10 and may allow the laser beam to pass the intensity adjusting unit. The intensity adjusting unit may have a first part which corresponds to the first area A1 and has a relatively high transmittance of the laser beam, a second part which corresponds to the second area A2 and has a relatively low transmittance of the laser beam, or the like. The display sealing apparatus may further include a location adjusting unit which adjusts a location of the intensity adjusting unit so that the intensity adjusting unit is disposed on the optical path via which the laser beam emitted by the laser beam source 20 reaches the encapsulation substrate 120, etc. on the stage 10 or the intensity adjusting unit is not disposed on the optical path.

The display sealing apparatus has been described, but embodiments are not limited thereto. For example, a method of manufacturing a display apparatus by using the display sealing apparatus is also included in the scope of the embodiments.

In the method of manufacturing a display apparatus according to embodiments, a display device is formed on a display area DA of the rear substrate 110. Then, the rear substrate 110 and the encapsulation substrate 120 are aligned to dispose the display device in the display area DA therebetween. Further, the sealant 130 is disposed in an outer region of the display area DA and to surround the display area DA between the rear substrate 110 and the encapsulation substrate 120. The rear substrate 110 and the encapsulation substrate 120 are sealed by irradiating the laser beam onto the rear substrate 110 or the encapsulation substrate 120 along the sealant 130 while rotating the laser beam L3 along the closed curve (for example, CL of FIG. 3 or FIG. 5) o an outer surface of the rear substrate 110 or the encapsulation substrate 120.

As described above, it is important in the sealing process is to irradiate the laser beam onto the sealant 130 at a predetermined and uniform intensity. However, as the intensity of the laser beam emitted from the laser beam source 20 may be non-uniform due to internal or external factors, the intensity of a laser beam irradiated onto a certain part of the sealant 130 may be potentially different from an intensity of the laser beam irradiated onto another part of the sealant 130. Accordingly, the rear substrate 110 and the encapsulation substrate 120 may not be attached at a uniform intensity. When the sealant 130 has defects caused by such differences during the sealing process, problems such as improper adhesion of the rear substrate 110 and the encapsulation substrate 120, or weakened adhesion of the rear substrate 110 and the encapsulation substrate 120 may be caused. The problems may result in the separation of the rear substrate 110 and the encapsulation substrate 120, the deterioration of the display device disposed between the rear substrate 110 and the encapsulation substrate 120, or the like.

In contrast, in the case of the method of manufacturing the display apparatus according to the present embodiment, the laser beam is irradiated onto the rear substrate 110 and the encapsulation substrate 120 along the sealant 130, but the laser beam L3 is rotated while being irradiated along the closed curve (for example, CL of FIG. 3 or FIG. 5) in the outer surface of the rear substrate 110 or the encapsulation substrate 120. That is, the laser beam L3 is rotated at a high angular velocity to be irradiated onto the encapsulation substrate 120, etc., so the irradiation area IA may have a donut shape. Accordingly, even if a sudden change of a laser beam output in the laser beam source 20 occurs, the laser beam is irradiated onto an entire irradiation area IA at substantially the same intensity.

As described above with reference to FIGS. 2, 3, 5 and other drawings, the aforementioned closed curve may be a circumference of a circle. During the sealing process, the closed curve CL described with reference to FIG. 5 is divided into the areas A1 through A8. The first intensity of the laser beam L3 reaching the rear substrate 110 or the encapsulation substrate 120 via the first area A1 of the areas A1 through A8 may be different from the second intensity of the laser beam L3 reaching the rear substrate 110 or the encapsulation substrate 120 via the second area A2 of the areas A1 through A8.

As described above with reference to FIG. 3, the rear substrate 110 and the encapsulation substrate 120 may be attached to each other at a uniform intensity in the inner region IR, the outer region OR, etc. of the area where the sealant 130 is curved. In this case, the first intensity and the second intensity of the laser beam L3 may be adjusted by the laser beam source 20 emitting the laser beam L1. Alternatively, the first intensity and the second intensity of the laser beam L3 may be adjusted by the intensity adjusting unit disposed on the optical path via which the laser beam L1 emitted by the laser beam source 20 reaches the rear substrate or the encapsulation substrate.

By way of summation and review, when a sealant has defects during a sealing process, problems such as improper adhesion of a rear substrate and an encapsulation substrate, or weakened adhesion of the rear substrate and the encapsulation substrate may be caused. Afterwards, the above problems may result in separation of the rear substrate and the encapsulation substrate, deterioration of the display device disposed between the rear substrate and the encapsulation substrate, or the like. Therefore, one or more embodiments provide a display sealing apparatus capable of decreasing an occurrence rate of defects in a sealing process of a display manufacturing procedure, and a method of manufacturing a display apparatus by using the display sealing apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
   forming a display device on a display area of a rear substrate;
   aligning the rear substrate and an encapsulation substrate, such that the display device is between the rear substrate and the encapsulation substrate and a sealant outside the display area and surrounding the display area is between the rear substrate and the encapsulation substrate; and
   rotating a laser beam along a closed curve while irradiating the laser beam onto an outer surface of the rear substrate or the encapsulation substrate, such that the rear substrate and the encapsulation substrate are sealed,
   wherein rotating the laser beam along the closed curve includes:
      dividing the closed curve into a plurality of areas; and
      adjusting a first intensity of a laser beam, which reaches the rear substrate or the encapsulation substrate via a first area of the plurality of areas, to be different from a second intensity of a laser beam, which reaches the rear substrate or the encapsulation substrate via a second area of the plurality of areas, wherein the first intensity and the second intensity of the laser beam are adjusted by a laser beam source emitting the laser beam.

2. The method as claimed in claim 1, wherein the closed curve is a circumference of a circle.

3. The method as claimed in claim 1, wherein the closed curve is within the outer surface of the rear substrate or the encapsulation substrate.

* * * * *